United States Patent [19]

Whiteside

[11] Patent Number: 5,644,605
[45] Date of Patent: Jul. 1, 1997

[54] JITTER ATTENUATOR

[75] Inventor: Frank A. Whiteside, Coppell, Tex.

[73] Assignee: Dallas Semiconductor Corp., Dallas, Tex.

[21] Appl. No.: 495,710

[22] Filed: Jun. 27, 1995

Related U.S. Application Data

[63] Continuation of Ser. No. 209,138, Mar. 9, 1994, abandoned, which is a continuation of Ser. No. 612,648, Nov. 13, 1990, abandoned.

[51] Int. Cl.$^6$ ........................................... H03D 3/18
[52] U.S. Cl. .................. 375/375; 375/371; 327/12
[58] Field of Search ........................ 375/371, 372, 375/375, 376; 327/144, 162, 163, 3, 12; 331/11, 25

[56] References Cited

U.S. PATENT DOCUMENTS

| | | | |
|---|---|---|---|
| 3,924,197 | 12/1975 | Okano et al. | 331/12 |
| 4,069,462 | 1/1978 | Dunn | 331/11 |
| 4,090,143 | 5/1978 | Merrell | 327/8 |
| 4,291,274 | 9/1981 | Suzuki et al. | 327/12 |
| 4,404,530 | 9/1983 | Stryer | 331/1 A |
| 4,805,198 | 2/1989 | Stein et al. | 375/371 |
| 4,837,781 | 6/1989 | Hickling | 331/11 |
| 4,888,564 | 12/1989 | Ishigaki | 331/12 |
| 4,896,122 | 1/1990 | Tehernia et al. | 331/158 |
| 4,940,952 | 7/1990 | Kegasa | 331/27 |
| 4,941,156 | 7/1990 | Stein et al. | 375/372 |
| 4,942,593 | 7/1990 | Whiteside et al. | 375/372 |
| 5,150,386 | 9/1992 | Stern et al. | 375/371 |

OTHER PUBLICATIONS

Hein, Jerrell "LSI Architectures for Data/Clock Recover," *IEEE Conference*, 1986, pp. 1298–1301.

Stern, Ken and Robert F. Bridge "Getting the Most from Existing Twisted-Pair Transmission Media," Telecommunications Dec. 1986, pp. 45–51, 56.

Keiser, Bernhard E. and Eugene Strange, *Digital Telephony and Network Integration*, Van Norstrand Reinhold Company: 1985, pp. 151–152.

Bellamy, John, Digital Telephony, John Wiley & Sons: New York, 1982, pp. 325–327.

Rockwell Datasheet "R8069 Line Interface Unit (LIU)".

Gardner, Floyd M. Ph.D., *Phaselock Techniques*, John Wiley & Sons: New York, 1979 (Second Edition), pp. 84–87.

Yarak, Dennis et al., "A 2.56.Mb/s Digital Local-Loop Transmitter/Receiver," 1985 IEEE International Solid-State Circuits Conference, 32nd ISSCC. Digest of Technical Papers, pp. 154–155, 330, 1985, New York, NY.

*Primary Examiner*—Young T. Tse

[57] ABSTRACT

Jitter attenuators (100) with a phase detector (104) to control a crystal oscillator to remove jitter wherein the phase detector includes both a sequential phase/frequency detector (200) of low transistor count and an arrangement of two sequential phase/frequency detectors (198 and 200) to increase gain and two drivers for the crystal oscillator.

7 Claims, 17 Drawing Sheets

RESPONSE OF DUAL SEQUENTIAL PHASE-FREQUENCY DETECTORS

DUAL-SLOPE EFFECT OF PREFERRED EMBODIMENT

IDEALIZED CRYSTAL OSCILLATOR

Neglect holder capacitance;
$C_{L1} = C_{L2} \gg C_m$

For oscillation, $$g_m \geq \frac{R_s}{(X_{CL})^2} \quad \left[ \equiv (2\pi f_r C_L)^2 R_s \right] = R_s w^2 C_L^2$$

$L_m$ = xtal mechanical inductance
$C_m$ = xtal mechanical capacitance
$R_s$ = total series resistance, including xtal

JITTER ATTENUATOR

This application is a continuation of application Ser. No. 08/209,138 filed on Mar. 9, 1994 which is a continuation of application Ser. No. 07/612,648 filed on Nov. 13, 1990, now both abandoned.

PARTIAL WAIVER OF COPYRIGHT

All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork rights whatsoever.

CROSS-REFERENCE TO RELATED APPLICATIONS

The following U.S. patents disclose related subject matter: U.S. Pat. Nos. 5,095,289 and 5,142,555, both filed on the same date as this application. These cross-referenced applications have a common assignee with the present application.

BACKGROUND AND SUMMARY OF THE INVENTION

The present invention relates to electronic devices, and, more particularly, to semiconductor devices useful in communications.

Communications over telephone lines and other media often make use of protocols that require information be synchronously formatted in frames. For example, the T1 standard developed by AT&T in the early 1960s to support long-haul pulse-code modulation (PCM) voice transmission is the first-level standard high-speed data interface to the telephone network in the United States and Canada and requires synchronous formatting in frames. Similarly, the CEPT standard used in Europe also demands such formatting. Receivers for communications with such protocols must be able to extract the timing of the transmission from the incoming signal so that the incoming data will be correctly sampled. Sampling with improper timing may lead to errors in the received data.

T1 transmission is based on twisted pair wiring, with separate pairs used for the transmit and receive sides. T1 links require a repeater circuit every 6,000 feet to regenerate the attenuated signal; an office repeater is required when a loop terminates into station electronics. T1 transmission rate (also called DS-1 for Digital Signal 1) is nominally 1.544 Mbps (megabits per second), and this handles twenty-four multiplexed voice (VF) channels. Higher rate transmission systems include the DS-1C (based on T1C paired cable) at 3.152 Mbps, DS-2 (based on T2 paired cable) at 6.312 Mbps, DS-3 (based on FT-3 optical fibers or 3A-RDS radio) at 44.736 Mbps, and DS-4 (based on T4M coaxial cable or WT4 waveguide or DR18 radio or FT4 fiber optic) at 274.176 Mbps.

The T1 standard uses an "alternate-mark-inversion" (AMI) format which means that each "1" bit is represented by a pulse and each "0" bit is represented by the absence of a pulse. The pulses are of alternating polarity, so the time average of the signal voltage will be at the "0" bit voltage level. AMI allows clock signals to be derived from data and thereby eliminates the need for separate clock transmission. The clock signal is extracted from the AMI waveform using phase-locked loop or LC tank circuitry. Clock extraction circuitry requires a minimum density of "1" bits to operate correctly. Various techniques are available to meet this density requirement: for example, T-carrier equipment uses bit 7 stuffing. And bipolar eight zero substitution (B8ZS) is an alternative.

Framing in T1 transmission refers to the format for data signaling, alarm, and synchronization information on the T1 trunk. A frame of data is made up of 193 bits, and is transmitted every 125 microseconds; i.e., 1.544 Mbps. The first bit transmitted is known as the F-bit. The F-bit position is used for synchronization, alarm and network data link. The F-bit is followed by twenty-four voice or data channels, each channel being eight bits wide. These channels (known as DS0 channels) each have a data rate of 64 Kbps (kilobits per second). Multiple frames make up a superframe (multiframe). One Extended Superframe consists of twenty-four frames. Twelve frames make up one D4 superframe.

A T1 receiver must extract the correct stream of "0" and "1" bits from the incoming analog signal. This entails both correct interpretation of voltage levels and correct sampling times. The T1 format guarantees an average data rate of 1.544 MHz, but the receiver must also be able to fine tune itself to the actual data frequency and also follow the phase of the incoming signal. For example, sampling on the edge of a pulse could lead to detection of either a "0" or a "1".

Thus a T1 receiver must be able to recover a correct clock signal from the incoming synchronous data signal. However, the incoming data stream may include random small shifts in the apparent delay between successive symbols. Because the clock must be extracted from the data, this can lead to significant phase modulation, or "jitter", of the clock. This jitter can become quite large in T1 communication systems because a T1 span may include several repeater stations which are typically based on LC tank circuits. Jitter may be both magnitude and frequency dependent.

A well known technique to filter out jitter is to write jittered data into a small first-in/first-out (FIFO) memory using the extracted jittered clock, and then read the data back out using a stable reference jitter-free clock. This reference clock is phase locked to the jittered clock, but filters out the jitter. Thus the FIFO provides an elastic temporary storage to filter out the data jitter. FIG. 1 schematically illustrates the basic configuration with the phase detector providing the locking of the voltage controlled crystal oscillator (VCXO) reference clock to the input jittered clock.

A switched capacitor VCXO in phase locked loop appears in C. Shih et al, Jitter Attenuation Phase Locked Loop Using Switched Capacitor Controlled Crystal Oscillator, 1988 IEEE Custom Integrated Circuits Conference, Digest article 9.5.1.

A problem of the known jitter attentuators is the low gain of known sequential phase/frequency detectors and the large number of transistors required in the realizations of such detectors and the large drivers used to pull the crystal oscillation frequency.

Present invention provides jitter attenuation by combining two or more sequential phase/frequency detectors to increase gain and by a realization of the sequential phase/frequency detector with a low number of transistors and by use of a cyrstal oscillator that has different drivers for different crystal loadings.

BRIEF DESCRIPTION OF THE DRAWINGS

The drawings are schematic for clarity.

DESCRIPTION OF THE PREFERRED EMBODIMENTS

Figure 1:
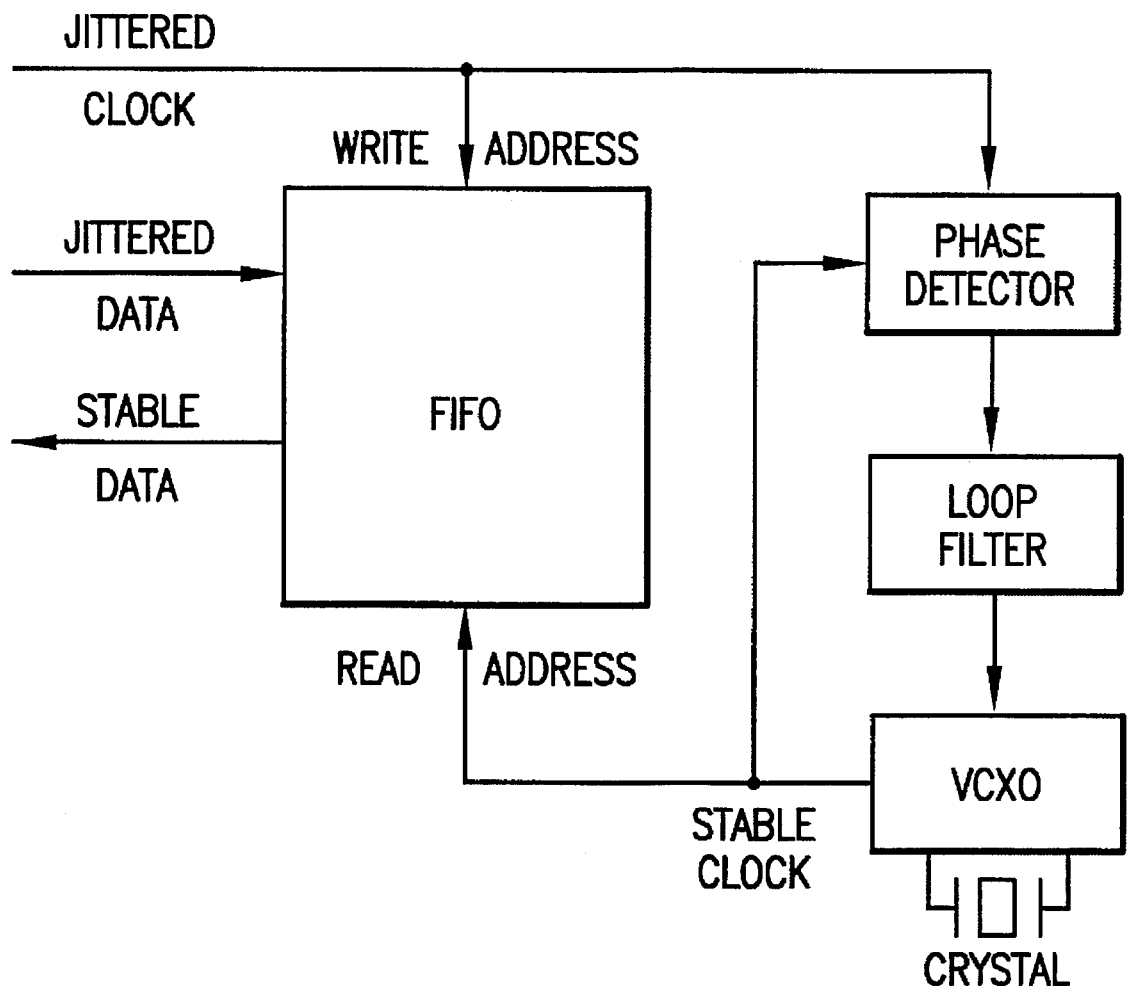
FIG. 1 shows a prior art jitter attenuator.
Figure 2A:
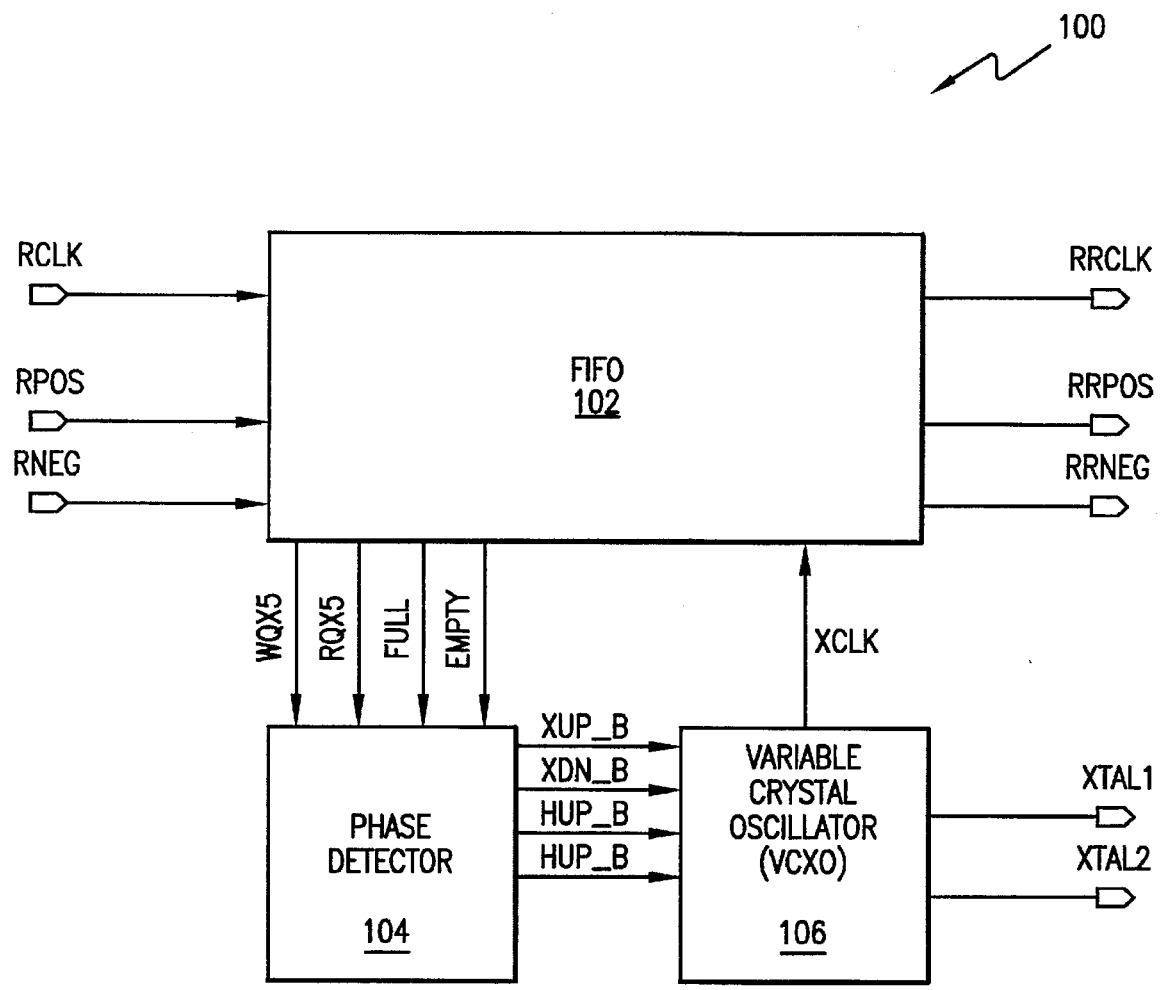
FIGS. 2a–b are schematic block diagrams of a first preferred embodiment jitter attenuator.
Figure 2B:
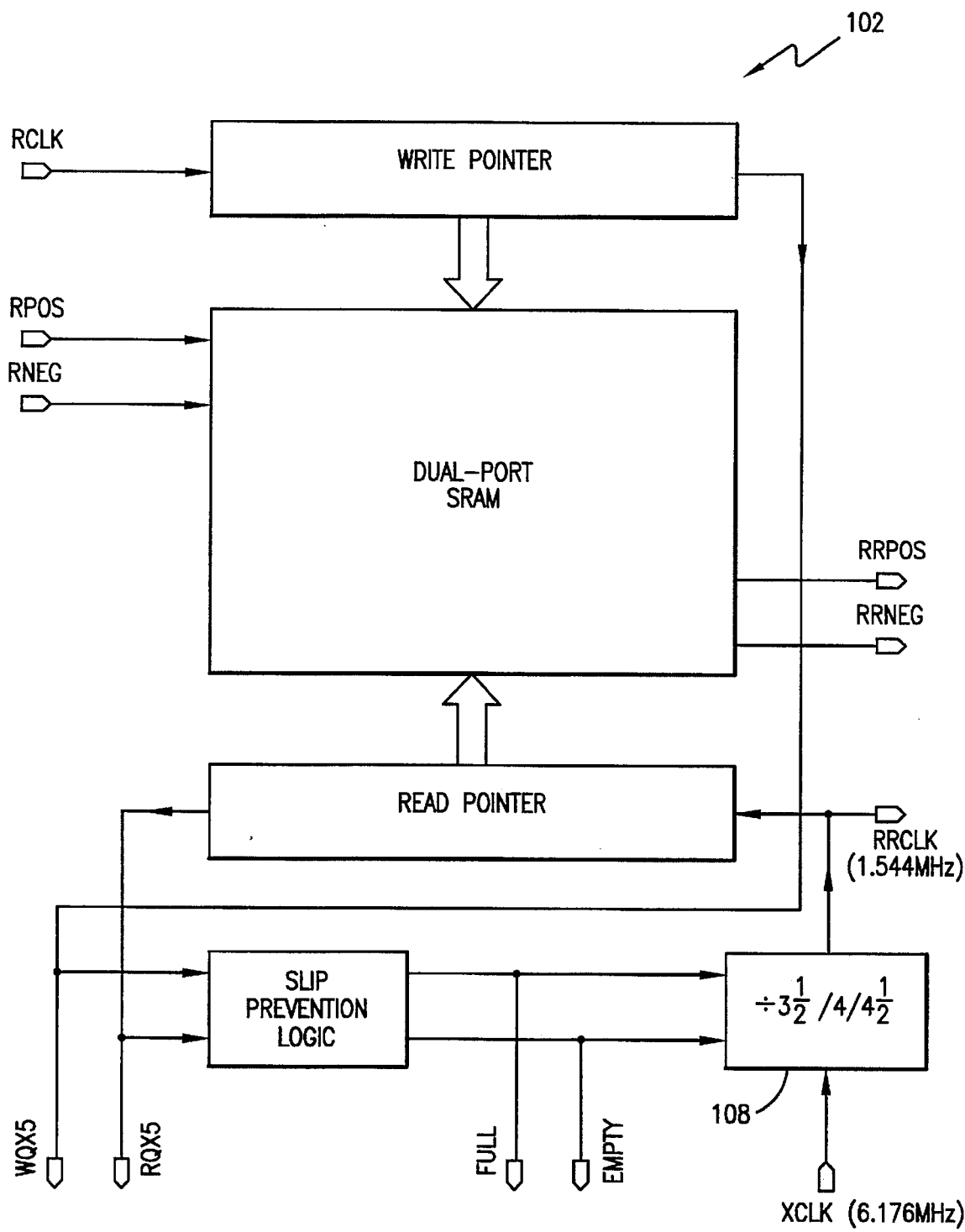
Figure 3A:
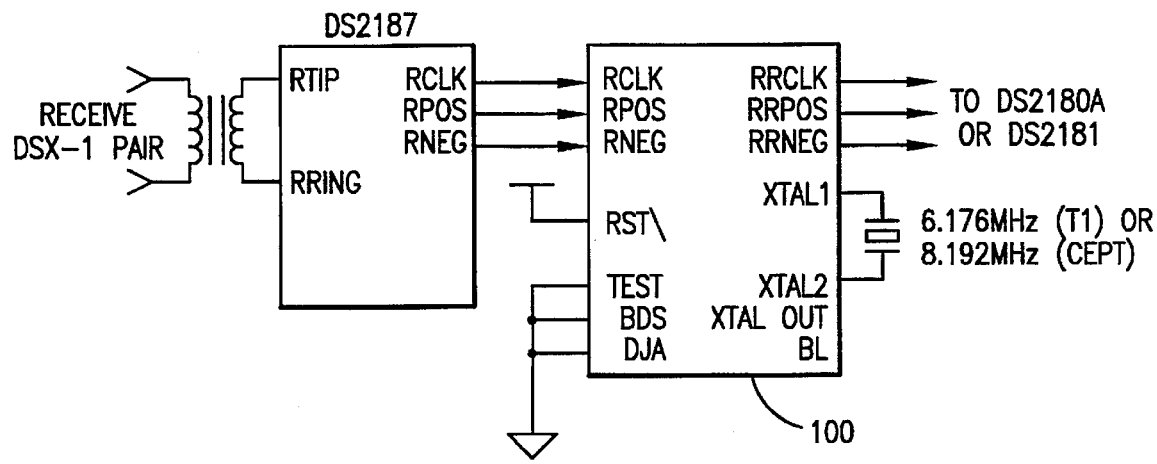
FIGS. 3a–b illustrate the first preferred embodiment.
Figure 3B:
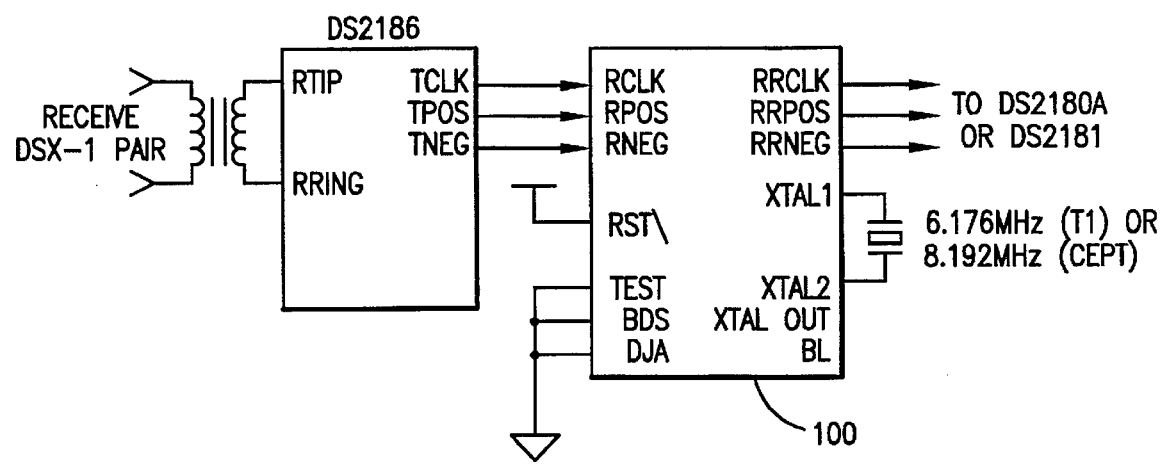

FIG. 2a is a simplified block diagram of the first preferred embodiment jitter attenuator, generally denoted 100, and FIG. 2b is a block diagram of FIFO 102. FIGS. 3a–b show jitter attenuator 100 connected to the public telephone network for use in receive (FIG. 3a) and transmit (FIG. 3b) applications. In each application there is an interface between jitter attenuator 100 and the telephone network; the receive interface may be a standard part such as the DS2187 interface manufactured by Dallas Semiconductor Corp, and the transmit interface may be a standard part such as the DS2186 interface also manufactured by Dallas Semiconductor Corp. Jitter attenuator 100 includes FIFO 102, phase detector circuitry 104, voltage controlled crystal oscillator 106, and various mnemonically labelled terminals. In particular, the received jittered clock is input at terminal RCLK (received clock) and the unjittered clock is output at terminal RRCLK (received reference clock). Jittered positive data and jittered negative data are input at terminals RPOS and RNEG, respectively, and the unjittered positive and negative data appear at terminals RRPOS and RRNEG, respectively. Terminals XTAL1 and XTAL2 are connections for the appropriate crystal (6.176 MHz for T1 and 8.192 MHz for CEPT) which is chosen as 4.0 times the basic clock frequency.

Jitter attenuator 100 operates as follows: the jittered clock input at RCLK is used to generate addresses for writing the incoming jittered data input at RPOS and RNEG to be stored in FIFO 102; as part of this address generation, the jittered clock is divided by 16 or 32 ($=2^5$), depending upon the word size in FIFO 102, and the divided jittered clock feeds from FIFO 102 to phase detector 104 at terminals WQX5 (Write Quotient X $2^5$). The output XCLK of voltage controlled crystal oscillator 106 is divided by 4.0 down to the basic clock frequency (1.544 MHz or 2.048 MHz) and then also divided by 16 or 32 in FIFO 102 and used to generate addresses for unjittered reading data from FIFO 102. This divided crystal clock feeds from FIFO 102 to phase detector 104 at terminal RQX5 (Read Quotient X $2^5$), and phase detector 104 compares the divided jittered clock with the divided crystal clock and uses the average difference to drive the crystal clock frequency to the average jittered clock frequency by frequency increase and decrease signals on terminals HUP_B, HDN_B, XUP_B, and XDN_B. FIFO 102 outputs signals FULL and EMPTY when the memory pointers (the write address and the read address) are near collision (such as occurs if the input jitter is large), indicating that the FIFO is nearly full or empty and in danger of overflowing or underflowing. The FULL and EMPTY signals then cause XCLK to be divided by 3.5 or 4.5, respectively, rather than by 4.0; see divider 108 in FIG. 2b. This causes a large shift in the RRCLK frequency and prevents a slip of data by a speed up or slow down in the reading of data from FIFO onto terminals RRPOS and RRNEG. Also, the FULL and EMPTY are used for partial resets of the phase detectors to make certain that the phase detectors are driving the variable crystal oscillator 106 in the correct frequency direction. As noted below, the phase detector can have more than one state for a given set of input conditions, and a synchronization method is necessary. Synchronization with FULL and EMPTY is transparent and does not cause any interruption in the operation.

Figure 4:
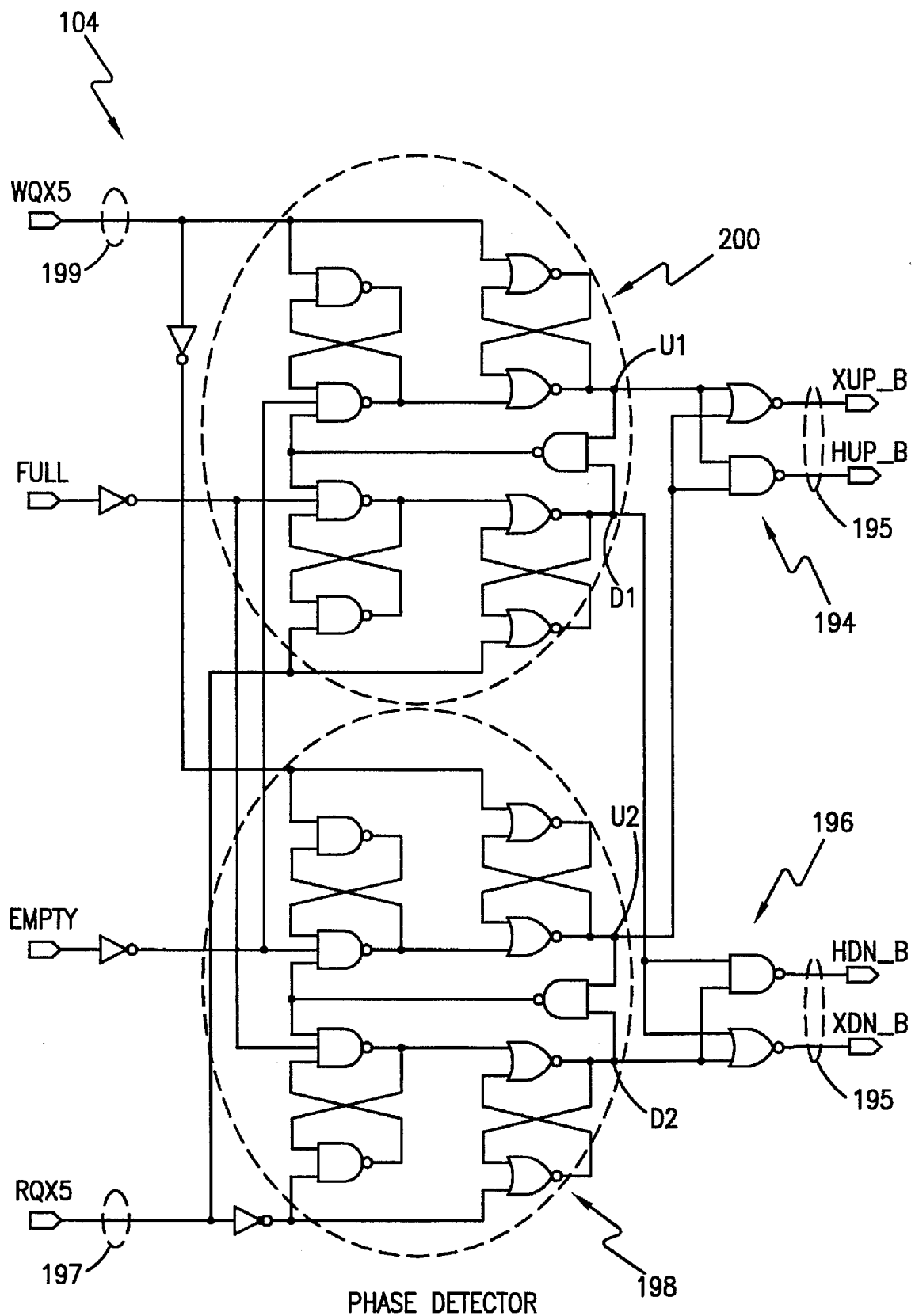
FIG. 4 is a schematic diagram of a portion of the first preferred embodiment.

FIG. 4 is a schematic diagram of phase detector circuitry block 104 and illustrates sequential phase/frequency detectors 198 and 200 with output combiners 194 and 196 and also the partial reset by a high on either FULL or EMPTY terminals. The jittered clock, after division by 16 or 32 in FIFO 102, enters at terminal WQX5 in the upper lefthand portion of FIG. 4, and the unjittered crystal reference clock, after division by 16 or 32 in FIFO 102, enters at terminal RQX5 in the lower lefthand portion. The divided jittered clock at WQX5 will be the "first clock" and the divided unjittered crystal clock at RQX5 will be the "second clock" in the following analysis of the sequential phase/frequency detectors 198 and 200.

Figure 5:
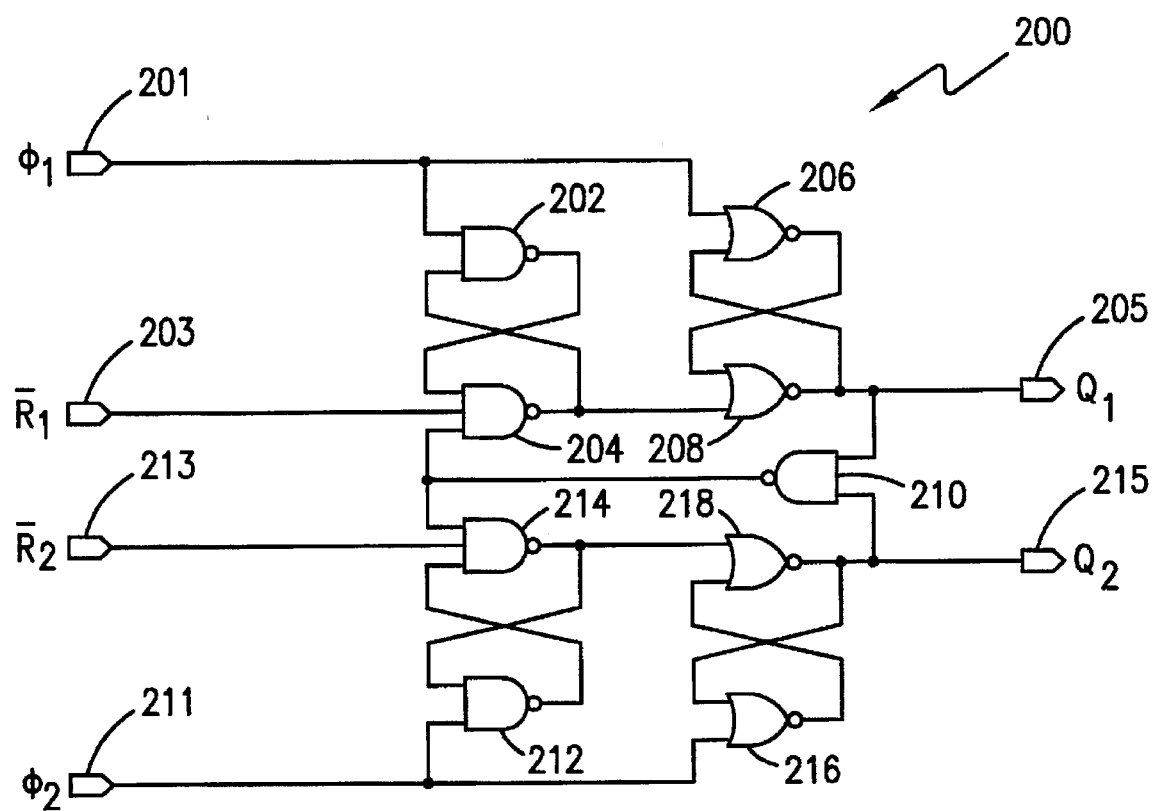
FIG. 5 is a schematic diagram of the preferred embodiment sequential phase/frequency detector.

FIG. 5 is a schematic diagram of preferred embodiment sequential phase/frequency detector 198 or 200 which includes NAND gates 202, 204, 210, 212, and 214; NOR gates 206, 208, 216, and 218; first clock input terminal 201 and second clock input terminal 211; reset input terminals 203 and 213, and first and second output terminals 205 and 215, respectively. Detector 200 is essentially two parallel NAND gate latches feeding two parallel NOR gate latches with feedback by NAND gate 210. Of course, detector 200 could have been realized in negative logic (a "1" is low and a "0" is high) by replacing the NAND gates with NOR gates and the NOR gates with NAND gates. Detector 200 operates as follows.

Detector 200 has three stable states for each pair of clock states; that is, for both first and second clocks high there are three stable states, for the first clock high and the second clock low there are another three stable states, and so forth. These twelve states are listed in the following table with a "0" for low and a "1" for high:

| | State | | | | | | | | | | | |
|---|---|---|---|---|---|---|---|---|---|---|---|---|
| Device | 1 | 2 | 3 | 4 | 5 | 6 | 7 | 8 | 9 | 10 | 11 | 12 |
| 201 | 1 | 1 | 1 | 1 | 1 | 1 | 0 | 0 | 0 | 0 | 0 | 0 |
| 211 | 1 | 1 | 1 | 0 | 0 | 0 | 1 | 1 | 1 | 0 | 0 | 0 |
| 202 | 0 | 0 | 1 | 0 | 0 | 1 | 1 | 1 | 1 | 1 | 1 | 1 |
| 204 | 1 | 1 | 0 | 1 | 1 | 0 | 0 | 0 | 0 | 0 | 0 | 0 |
| 206 | 0 | 0 | 0 | 0 | 0 | 0 | 1 | 0 | 1 | 1 | 1 | 0 |
| 208 | 0 | 0 | 1 | 0 | 0 | 1 | 0 | 1 | 0 | 0 | 0 | 1 |
| 210 | 1 | 1 | 1 | 1 | 1 | 1 | 1 | 1 | 1 | 1 | 1 | 1 |
| 212 | 0 | 1 | 0 | 1 | 1 | 1 | 0 | 0 | 1 | 1 | 1 | 1 |
| 214 | 1 | 0 | 1 | 0 | 0 | 0 | 1 | 1 | 0 | 0 | 0 | 0 |
| 216 | 0 | 0 | 0 | 1 | 0 | 1 | 0 | 0 | 0 | 1 | 0 | 1 |
| 218 | 0 | 1 | 0 | 0 | 1 | 0 | 0 | 0 | 1 | 0 | 1 | 0 |

Note that in all of the stable states the feedback NAND gate 210 is high. This is simply due to a low output by NAND gate 210 will drive each of NAND gates 204 and 214 high which in turn drives each of NOR gates 208 and 218 low and this drives NAND gate 210 back to high.

Also note that the outputs at terminals 205 and 215 which are the outputs of NOR gates 208 and 218 are never both high in any stable state. Additional circuitry may be added to suppress a momentary "glitch" where both outputs 208 and 218 are high, as is well known with phase detectors.

Initially, consider a low reset signal applied to both reset terminals 203 and 213. This drives NAND gates 204 and 214 both high, and thus NOR gates 208 and 218 both go low and the outputs at terminals 205 and 215 are both low. NAND gate 210 is also high. But the states of the other gates are determined by the first and second clock inputs at clock terminals 201 and 211. For example, if the input at clock terminal 201 is low, then both NAND gate 202 and NOR gate 206 are high. Conversely, if the input at clock terminal 201 is high, then both NAND gate 202 and NOR gate 206 are low. The same results apply to clock terminal 211 and gates 212 and 216 by symmetry. When the reset low signal at terminals 203 and 213 is released NAND gate 204 or 214 will switch low if the corresponding first or second clock is low. The other gates will remain in their reset states. Thus the reset states for the gates of detector 200 are well defined but dependent of the signals at clock terminals 201 and 211. In particular, state nos. 1, 4, 7, and 10 are the reset states.

Transitions between states as the first and second clocks switch are determined by presuming that the various gates have comparable delays. For example, state no. 1 will go to state no. 7 when the first clock goes low and will go to state no. 4 when the second clock goes low. State no. 4 will go to state no. 10 when the first clock goes low, state no. 7 will also go to state no. 10 when the second clock goes low. Thus transitions from reset states are to other reset states on a falling clock edge.

Contrarily, for a rising clock edge non-reset states can be reached from reset states: for a first clock rising edge reset state no. 10 goes to state no. 6 which has a high output at terminal 205; and symmetrically, for a second clock rising edge reset state no. 10 goes to state no. 9. Note that with a falling edge of the first clock state no. 6 does not return to reset state no. 10 but rather to state no. 12 which retains the high output at terminal 205. Symmetrically, for a falling edge of the second clock state no. 9 goes to state no. 11 which retains the high output at terminal 215.

Complete analysis of the transitions yields the following transition tables:

For a first clock falling edge:
| Initial | 1 | 2 | 3 | 4 | 5 | 6 | 7 | 8 | 9 | 10 | 11 | 12 |
|---|---|---|---|---|---|---|---|---|---|---|---|---|
| Final | 7 | 9 | 8 | 10 | 11 | 12 | | | N/A | | | |

For a second clock falling edge:
| Initial | 1 | 2 | 3 | 4 | 5 | 6 | 7 | 8 | 9 | 10 | 11 | 12 |
|---|---|---|---|---|---|---|---|---|---|---|---|---|
| Final | 4 | 5 | 6 | N/A | | | 10 | 12 | 11 | | N/A | |

For a rising first clock edge:
| Initial | 1 | 2 | 3 | 4 | 5 | 6 | 7 | 8 | 9 | 10 | 11 | 12 |
|---|---|---|---|---|---|---|---|---|---|---|---|---|
| Final | | N/A | | | | 6 | 3 | 3 | 1 | 6 | 4 | 6 |

For a rising second clock edge:
| Initial | 1 | 2 | 3 | 4 | 5 | 6 | 7 | 8 | 9 | 10 | 11 | 12 |
|---|---|---|---|---|---|---|---|---|---|---|---|---|
| Final | N/A | | 2 | 2 | 1 | | N/A | | | 9 | 9 | 7 |

Figure 6:
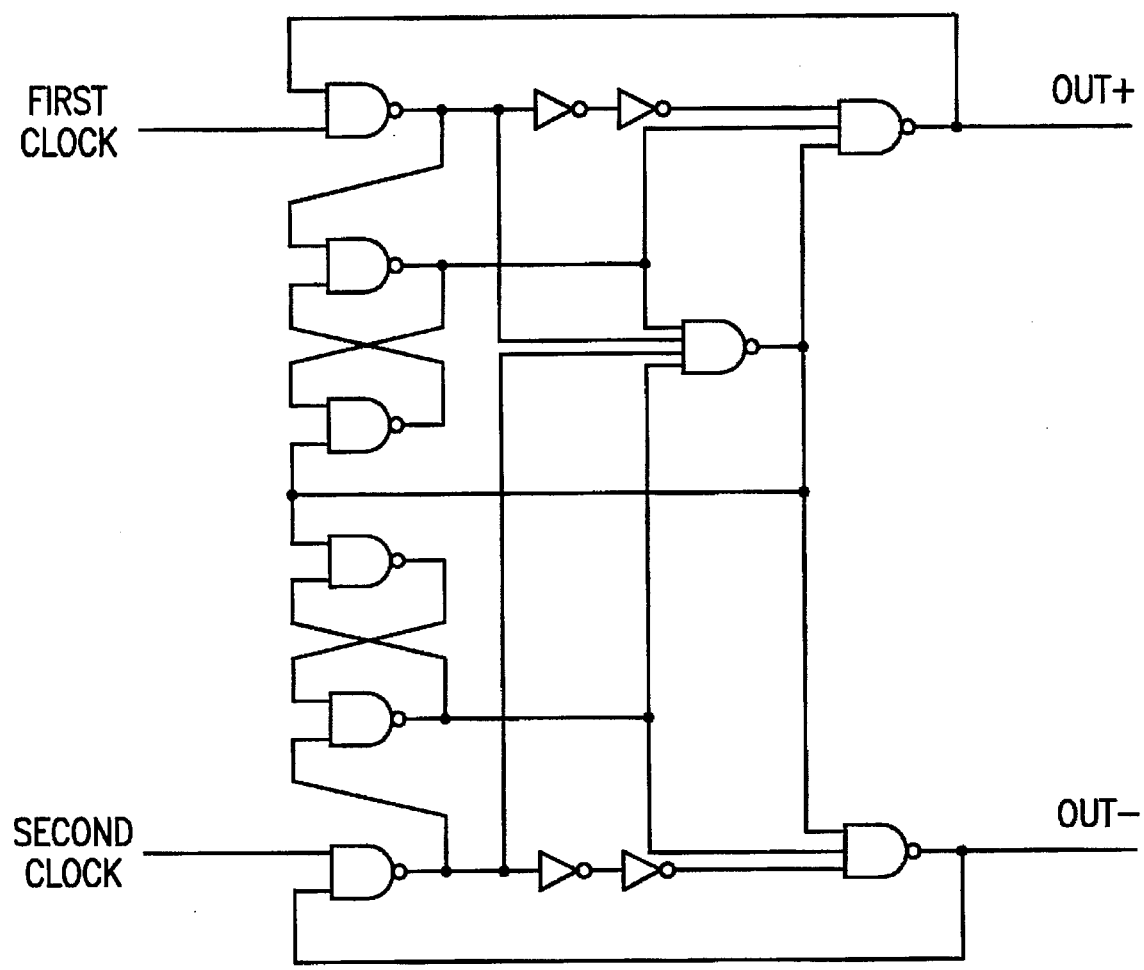
FIG. 6 is a schematic diagram of a prior art sequential phase/frequency detector.

Now these transitions are similar to those of the known sequential phase/frequency detector (PFD) of FIG. 6. However, detector 200 only uses nine two-input gates (ignoring the reset); whereas, the PFD of FIG. 6 uses six two-input gates, two three-input gates, plus one four-input gate (plus four inverters). So a CMOS version of detector 200 has only 36 transistors compared to 44 (not counting the inverters) for the PFD of FIG. 6. Furthermore, detector 200 has advantages from the standpoint of being easily reset, and this extends to partial resets (e.g., input at 203 or 213) which can be used to control the state of detector 200 during overload conditions, such as FULL and EMPTY signals.

Figure 7:
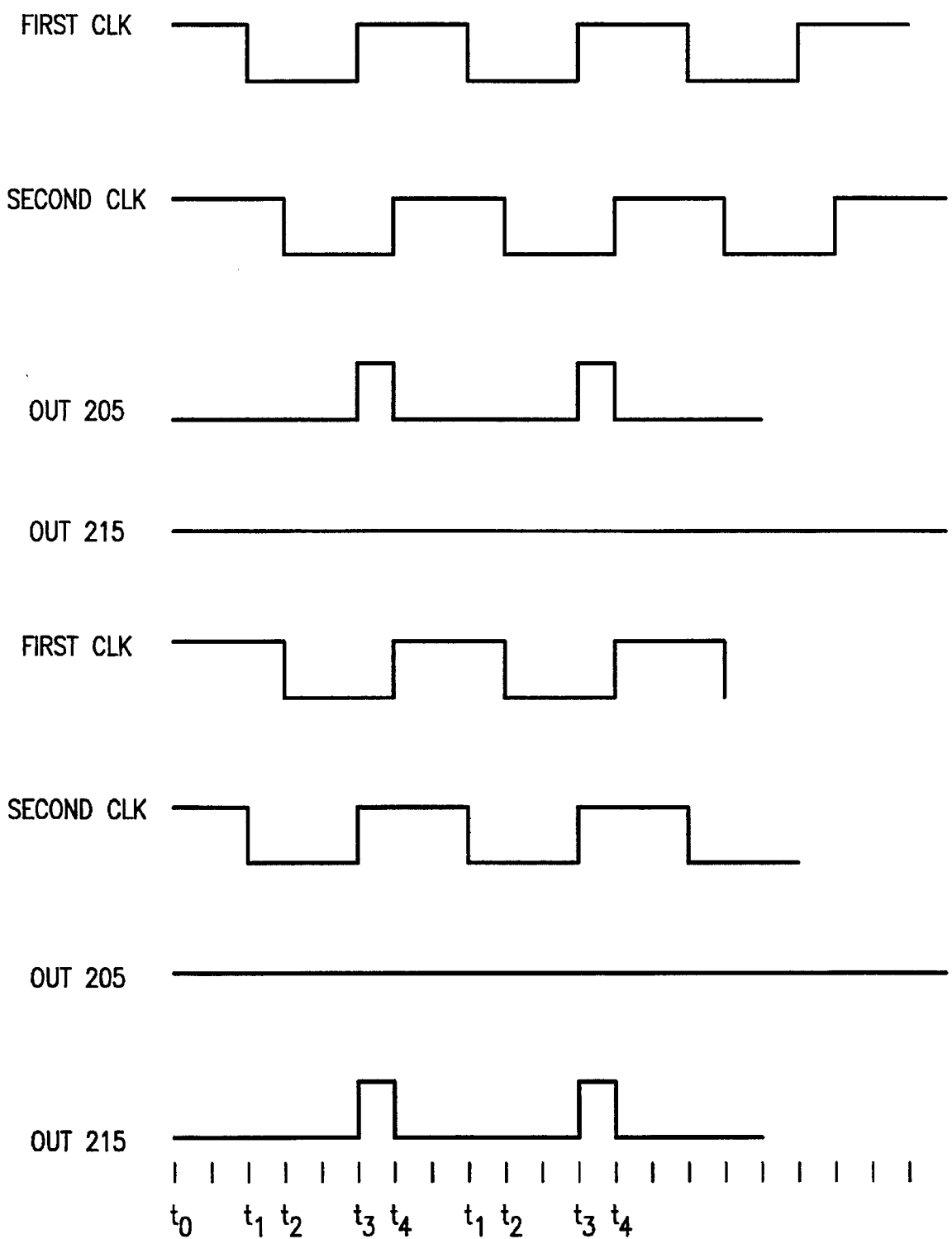
FIG. 7 is a timing diagram for the detector of FIG. 5.

Detector 200 (and the PFD of FIG. 6) detect the phase difference in two digital signals of the same frequency as illustrated in FIG. 7. In particular, the upper four traces of FIG. 7 show the case of the first clock leading the second clock and the lower four traces show the case of the second clock leading the first clock. Presuming that at time t0 detector 200 is in state no.1 which is a reset state with low outputs, the case of the first clock leading proceeds as follows: at time t1 the first clock falls and detector 200 switches into state no.7 which is a reset state with low outputs. Then at time t2 the second clock falls and detector 200 switches into state no.10 which is another reset state with low outputs. Next, at time t3 the first clock rises, and detector 200 switches into state no.6 which has a high output at terminal 205. Lastly, at time t4 the second clock rises and detector 200 returns to state no.1 and the outputs drop low. The state switching repeats itself, and the duty cycle of the high output at terminal 205 is proportional to the phase difference of the two clocks.

The case of the second clock leading is analogous. Again presume a start at time t0 in state no.1, then at time t1 detector 200 switches to state no.4, at time t2 to state no.10, at time t3 to state no.9 which has a high output at terminal 215, and at time t4 back to state no.1. Again, the duty cycle of the output at terminal 215 is proportional to the phase difference of the two clocks. This result is graphically demonstrated in FIG. 8 wherein the output at terminal 205 is deemed positive and the output at terminal 215 is deemed negative. Recall that the output at terminal 205 drives VCXO 106 to a higher frequency and the output at terminal 215 drives VCXO 106 to a lower frequency.

Observe that in FIG. 7 the presumption was that at time t0 detector 200 was reset (to state no.1). If instead a reset had been done just after times t1 or t2, then the same state switching would have occurred because states nos. 7 and 10 (or nos. 4 and 10 for the case of the second clock leading) are also reset states. However, if a reset had been done just after time t3, then the result would be as illustrated in FIG. 9. In more detail, the upper four traces of FIG. 9 again show the case of the first clock leading and the lower four traces show the case of the second clock leading. For the first clock leading case detector 200 would be starting at state no.4 and then switch to state no. 2, then state no.9, then state no.11, and back to state no.4. The output at terminal 215 would just be the complement of that of at terminal 205 in connection with FIG. 7. The result is essentially the same: the output becomes more positive (less negative) in proportion to the phase difference. Similarly, for the case of the second clock leading the output becomes more negative (less positive) in proportion to the phase difference, and the states traversed would be starting with a reset after time t3 into state no.7, state no.3, state no.6, state no.12, and back to state no.7. Indeed, the situations illustrated in FIG. 9 correspond to the two output lines of FIG. 8 that do not intersect the origin.

Figure 8:
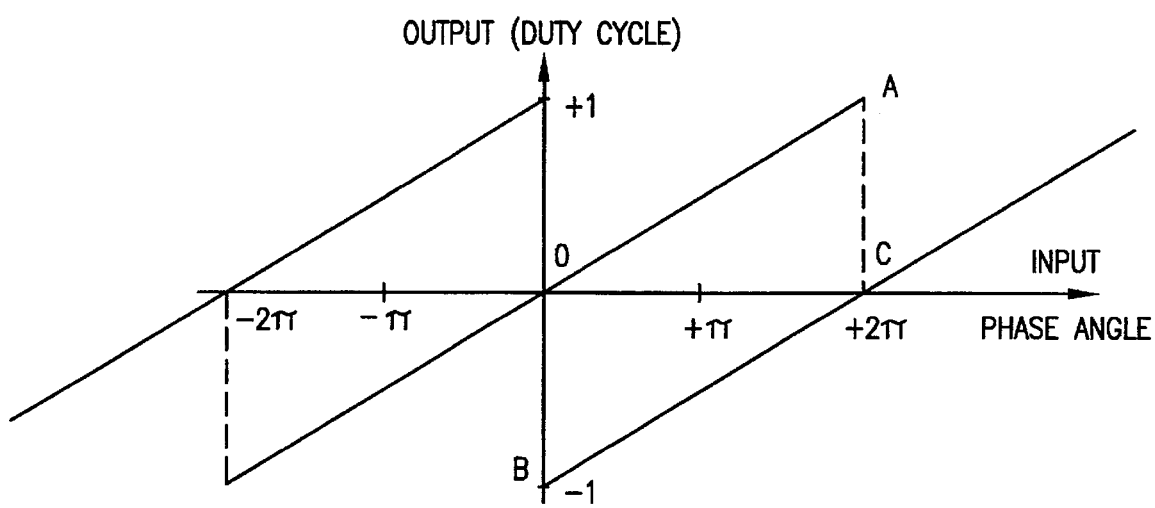
FIG. 8 is the response of the detector of FIG. 5.
Figure 9:
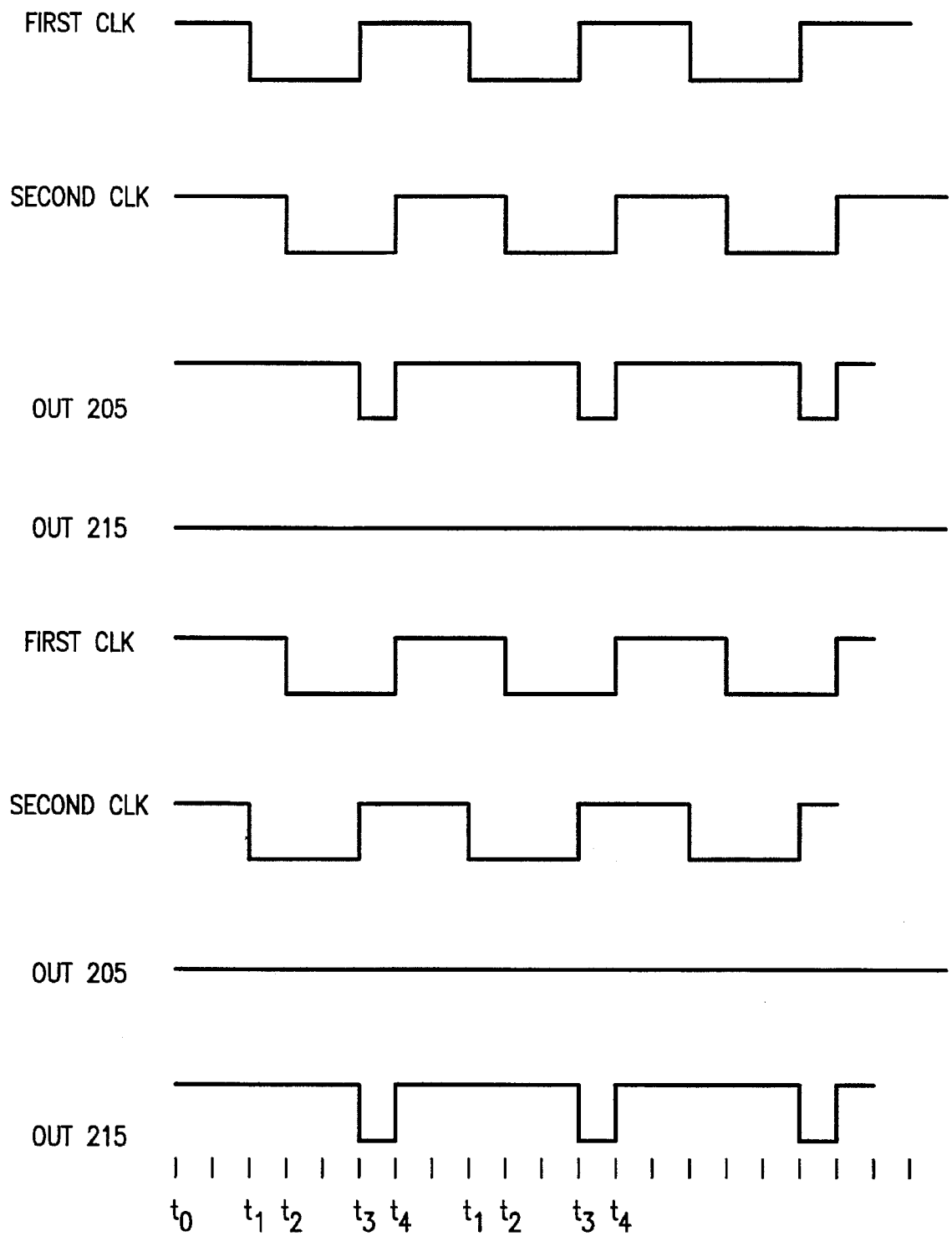
FIGS. 9–11 are further timing diagram for the detector of FIG. 5.

Indeed, for the first clock leading with a positive phase difference between 0 and $2\pi$, detector 200 could operate on either line OA or line BC of FIG. 8. For a phase difference between 0 and $\pi$, segment OA would correspond to a sequence of states nos. 1, 7, 10, 6 and segment BC would correspond to the sequence of states nos. 4, 2, 9, 11. Taking partial reset input 213 low during states nos. 2 or 9 (segment BC) would force detector 200 into states nos. 1 or 7 (segment OA), respectively. Likewise, taking partial reset 203 low would force detector 200 to change from state no. 6 into state no. 4.

This partial reset feature can be useful in situations where being able to control the response of phase detector 200 is desirable, such as:

(1) when the FIFO buffer (or the phase detector itself) is in or near an overflow condition;

(2) when two or more phase detectors must operate together and must be synchronized;

(3) if one of the inputs is noisy (which usually renders sequential phase detectors useless); or (4) if a phase locked loop needs to be slipped by one cycle at a time or otherwise thrown out of lock in a controlled manner.

As the phase difference between the first clock and the second clock increases to $\pi$ and beyond the presumption of a reset to state no.1 is unrealistic because the clocks are not both high for any significant time. Indeed, for a phase difference of just less than $\pi$, detector 200 is in state no.7 for the almost-half of a cycle that the first clock is low and the second clock is high and is in state no.6 for the other almost-half cycle that the first clock is high and the second clock is low. In this case the transition is from state no.7 to a brief stay in state no.10 when the second clock goes low and then immediately to state no.6 when the first clock goes high. Similarly, the sequence from state no.6 to state no.1 and then to state no.7 only stays briefly in state no.1. Now as the phase difference exceeds $\pi$, the bulk of the time is still spent in states nos.6 and 7, but the order of the clock switching reverses and the sequences become: from state no.7 to a brief stay in state no.3 and then to state no.6, and from state no.6 to a brief stay in state no.12 and then to state no.7. Since both states nos.3 and 12 have high outputs at terminal 205, the duty cycle of the output increases past 50% and up to 100% as the phase difference increases past $\pi$ up to $2\pi$, as shown in FIG. 8. Of course, the second clock leading by $\theta$ is the same as the first clock leading by $2\pi-\theta$.

Figure 10:
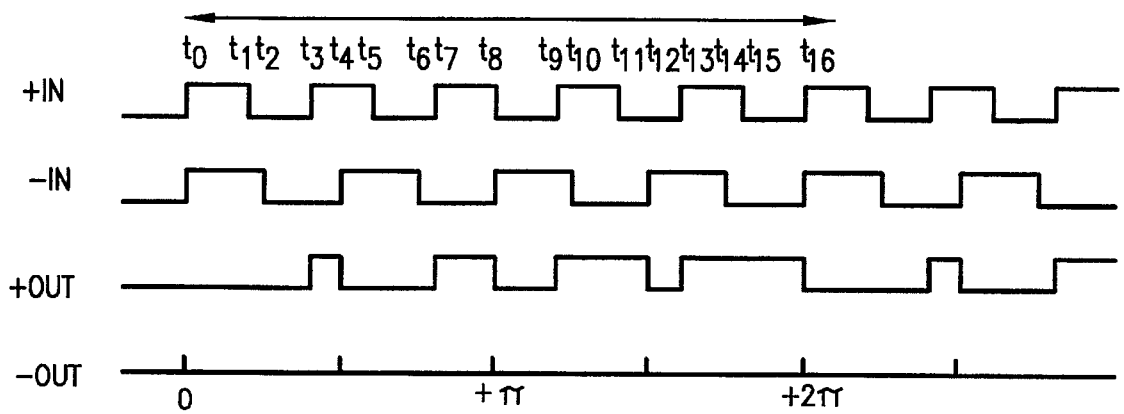

Detector 200 (and the PFD of FIG. 6) also detect frequency differences as illustrated in FIG. 10 which shows the case of the frequency of the first clock equal to 125% of the frequency of the second clock. Again, if at time t0 detector 200 is in reset state no.1, then it traverses its states as follows: time t1 into state no.7, time t2 state no.10, time t3 state no.6, time t4 state no.1, time t5 state no.7, time t6 state no.10, time t7 state no.6, time t8 state no.7, time t9 state no.3, time t10 state no.6, time t11 state no.12, time t12 state no.7, time t13 state no.3, time t14 state no.6, time t15 state no.12, and time t16 back to state no.1. This then repeats. States nos.3, 6, and 12 all have a high output at terminal 205, and states nos. 4, 7, and 10 are reset states; thus the output shown in FIG. 10. The duty cycle of the positive output for this situation is seen to be 50%. In fact, if the output is averaged over an entire cycle, then any two different frequencies that are not too different will yield an output with a 50% duty cycle. This is effectively just averaging local phase differences varying from 0 to $2\pi$.

Note that at times t8 and t16 both clocks were changing, but there is no ambiguity in the state changes: if at time t8 the first clock were deemed to rise slightly before the second clock fell then the sequence would be state no.6 to state no.12 to state no.7, whereas if the second clock fall were slightly before the first clock rise, then the sequence would be state no.6 to state no.1 to state no.7. At time t16 the situation is more complicated in that if the first clock rose before the second clock rose then the sequence would be state no.12 to state no.6 to state no.1, whereas with the second clock rise before the first clock rise, then the sequence would be state no.12 to state no.7 to state no.3 (i.e., the same as the changes at times t11-t12-t13). However, consideration of the circuit shows that simultaneous rises by both clocks leads to state no.1.

Figure 11:
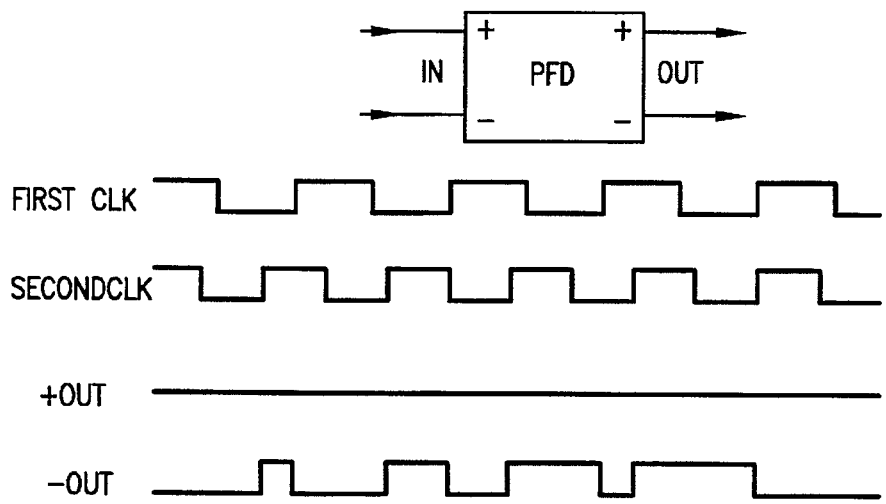

The case of the second clock having the higher frequency is illustrated in FIG. 11. Again starting at time t0 in reset state no.1, the sequence of states is time t1 into state no.4, time t2 state no.10, time t3 state no.9, time t4 state no.1, time t5 state no.4, time t6 state no.10, time t7 state no.9, time t8 state no.4, time t9 state no.2, time t10 state no.9, time t11 state no.11, time t12 state no.4, time t13 state no.2, time t14 state no.9, time t15 state no.11, and time t16 back to state no.1. The states nos.2, 9, and 11 have high outputs at terminal 215 and a duty cycle of 50% in FIG. 11.

Figure 12A:
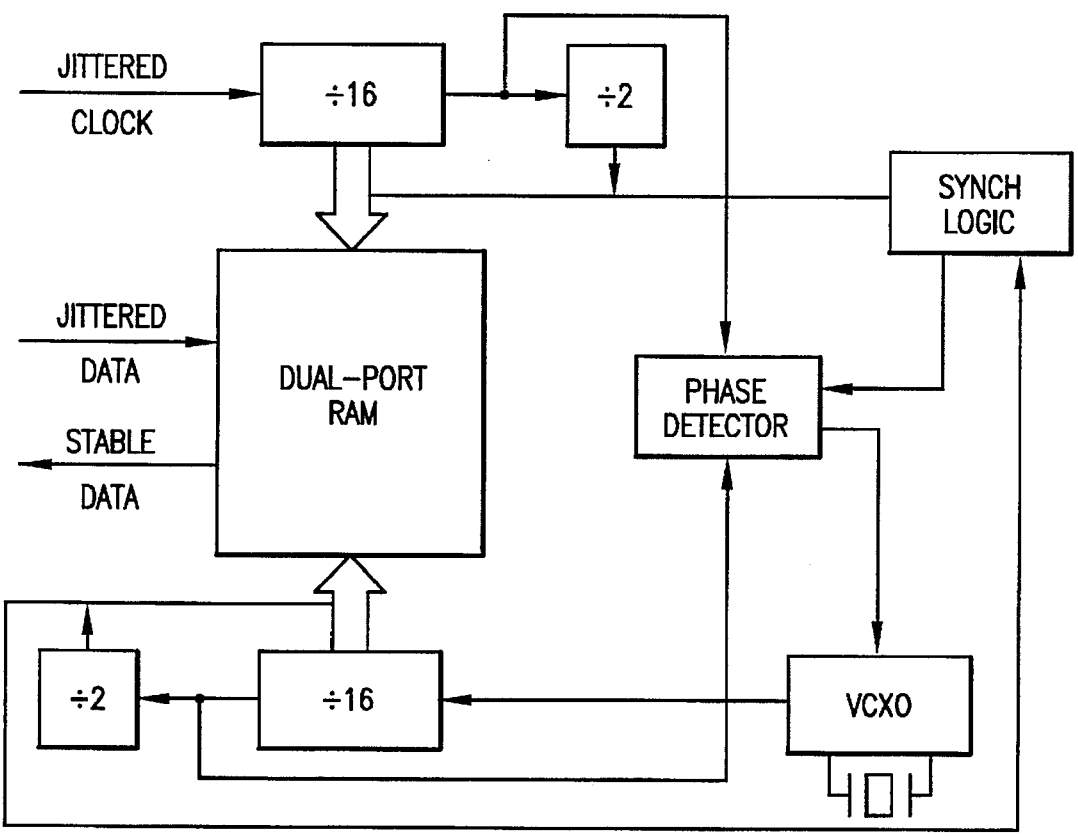
FIGS. 12a–b show jitter attenuator architectures.

FIG. 12a illustrates the typical jitter attenuator for 32-bit serial data words; once every 32 jittered clock cycles a 32-bit data word is written into FIFO, and once every 32 unjittered clock cycles a 32-bit data word is read out of FIFO. The circuit of FIG. 12a has a divide by 16 of the jittered clock fed to the phase detector and additional circuitry for the further divide by 2. This setup is needed because the usual phase detector does not have sufficient gain (slope of curve in FIG. 8) to drive the VCXO and must use a higher frequency to increase its gain (i.e., use the jittered clock divided by only 16 rather than divided by 32). Note that dividing the clock inputs to a sequential phase/frequency detector reduces the gain (output duty cycle per radian of phase difference) because the phase difference remains the same after division but the number of clock cycles per second has been divided. However, if the clock inputs are not divided or only divided by a small number, then the sequential phase/frequency detector may not accurately track the clock signal and may slip clock cycles. Thus there is an inverse relationship between the size of the FIFO and the gain of the phase detector, which determines the amount of jitter attenuation that occurs at any particular frequency.

Figure 12B:
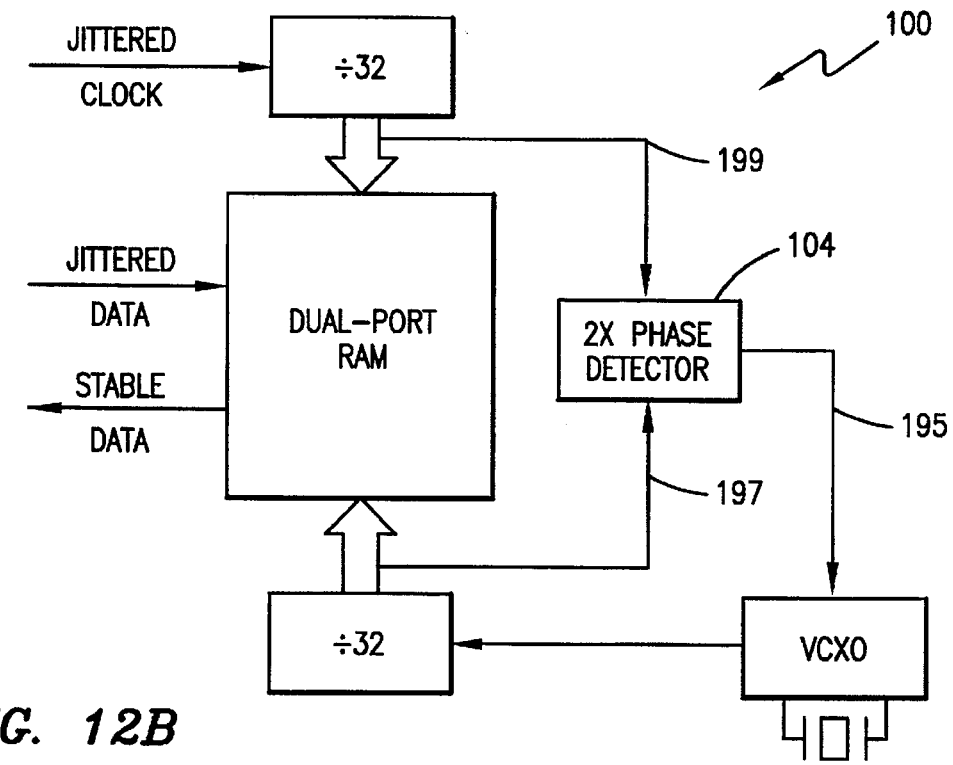
Figure 13:
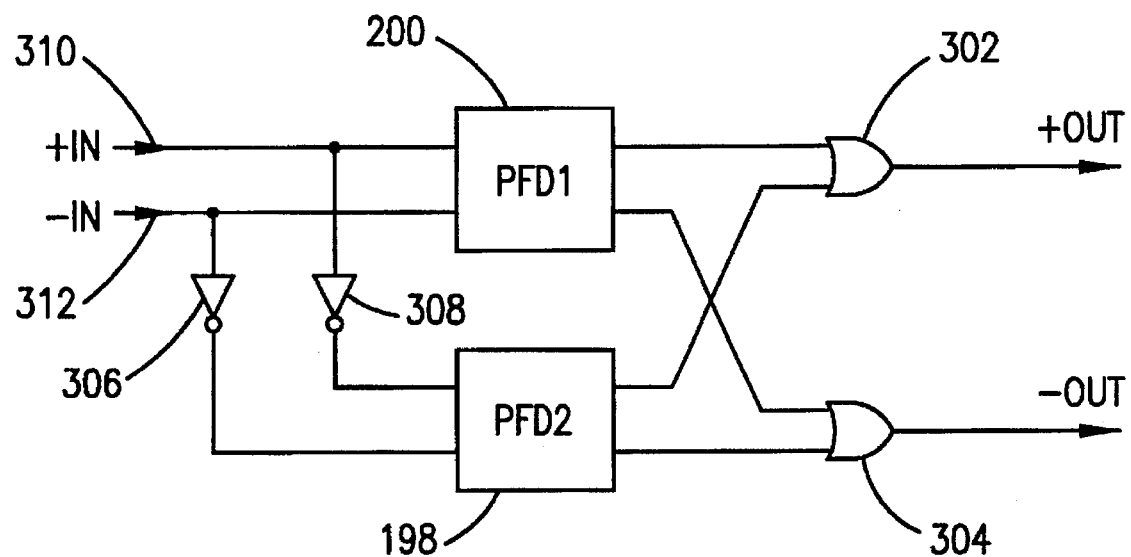
FIG. 13 illustrates a portion of circuitry of the first preferred embodiment.

In constrast, FIG. 12b shows the first preferred embodiment jitter attenuator 100 which has a gain of 2 in the phase detector 104 and thus avoids the extra divide by 2 and associated circuitry. This extra gain of 2 arises from the use of two detectors 198 and 200 as shown in FIG. 4 with combiners 194 and 196 having electrical nodes 195, 197, and 199. For explanation, FIG. 13 is a schematic diagram of a simplified two-detector arrangement which includes detectors 198 and 200, OR gates 302 and 304, inverters 306 and 308, first clock input 310, and second clock input 312; for clarity, the partial reset inputs are not shown. Because detector 198 has inputs that are the complements (through inverters 306 and 308) of the inputs of detector 200 and because the input clock signals have a duty cycle of 50%, the output of detector 198 will have the same waveform as the output of detector 200 but lag in phase by $\pi$. Hence for small phase differences between the first and second clocks, the outputs of detectors 198 and 200 will have the same polarity but not overlap. Thus the outputs are added by OR gate 302 if positive (the first clock leading the second clock) or added by OR gate 304 if negative (the first clock lagging the second clock). As the phase difference increases to $\pi$, the duty cycle of the output at the appropriate OR gate increases to 100%. When the phase difference exceeds $\pi$ but not $2\pi$, the outputs of detectors 198 and 200 overlap and the output at the appropriate OR gate is a constant high. See FIG. 14. Hence, the two-detector arrangement has double the gain of a one-detector arrangement for phase differences bewteen $-\pi$ and $\pi$.

Figure 15:
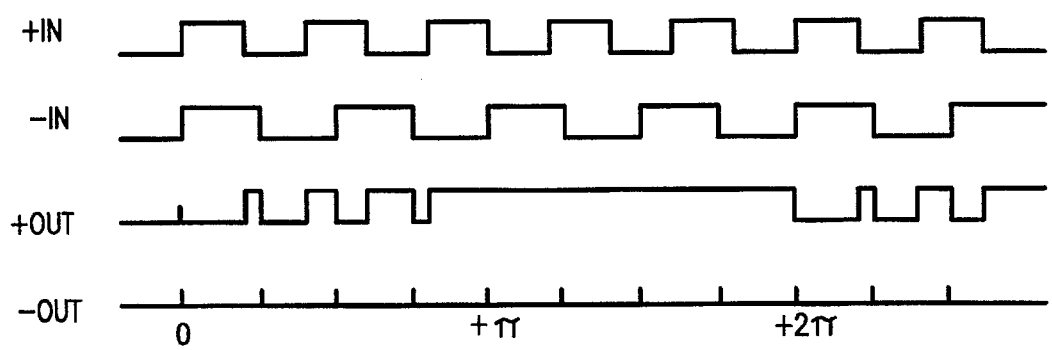
FIG. 15 is a timing diagram for the circuitry of FIG. 13.

FIG. 15 is a timing diagram illustrating the output of the two-detector arrangement for the case of the first clock with a higher frequency than the second clock. As noted in connection with FIG. 10, the different frequency output is essentially an average over the phase difference outputs from 0 to $2\pi$. Thus the two-detector arrangement has an output duty cycle of 75%.

Figure 14:
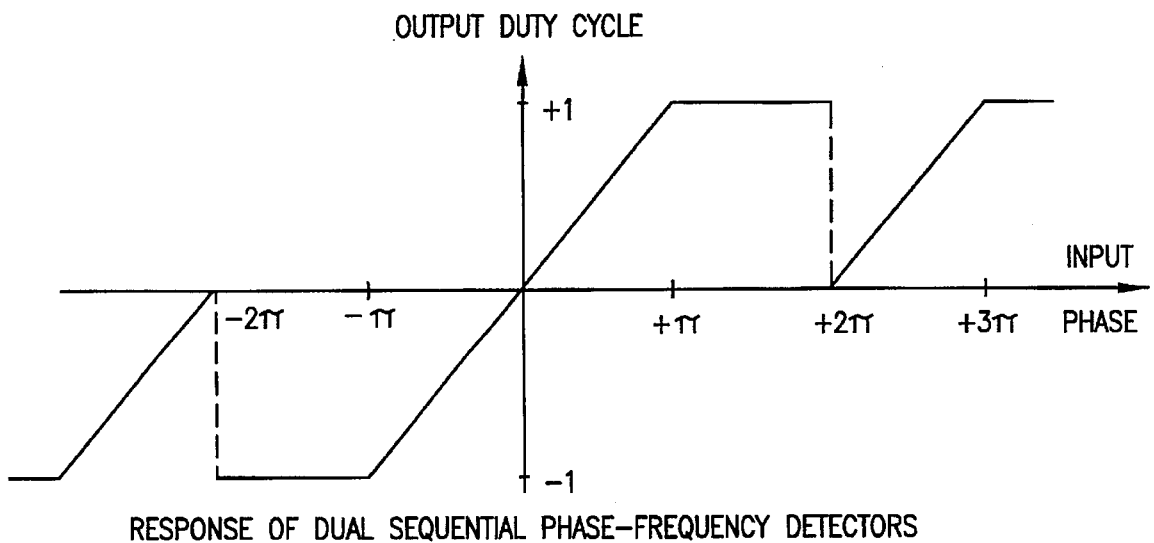
FIG. 14 shows the response of the circuitry of FIG. 13.
Figure 16:
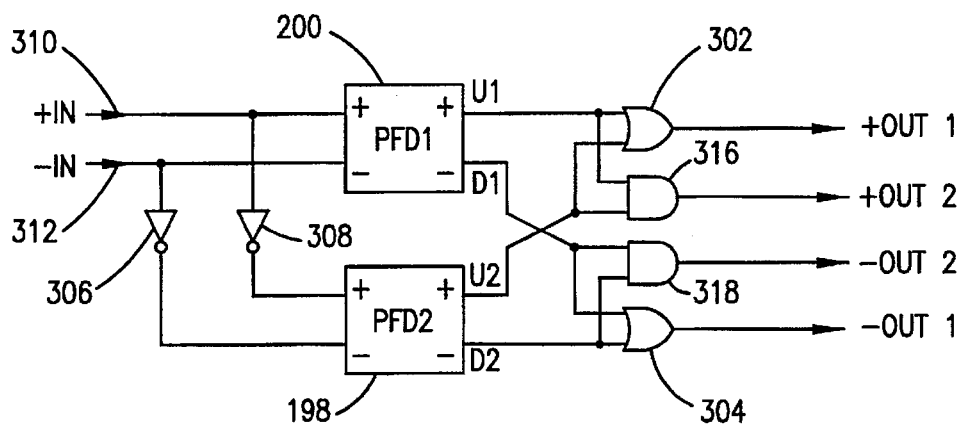
FIG. 16 illustrates a portion of the circuitry of the first preferred embodiment.
Figure 17:
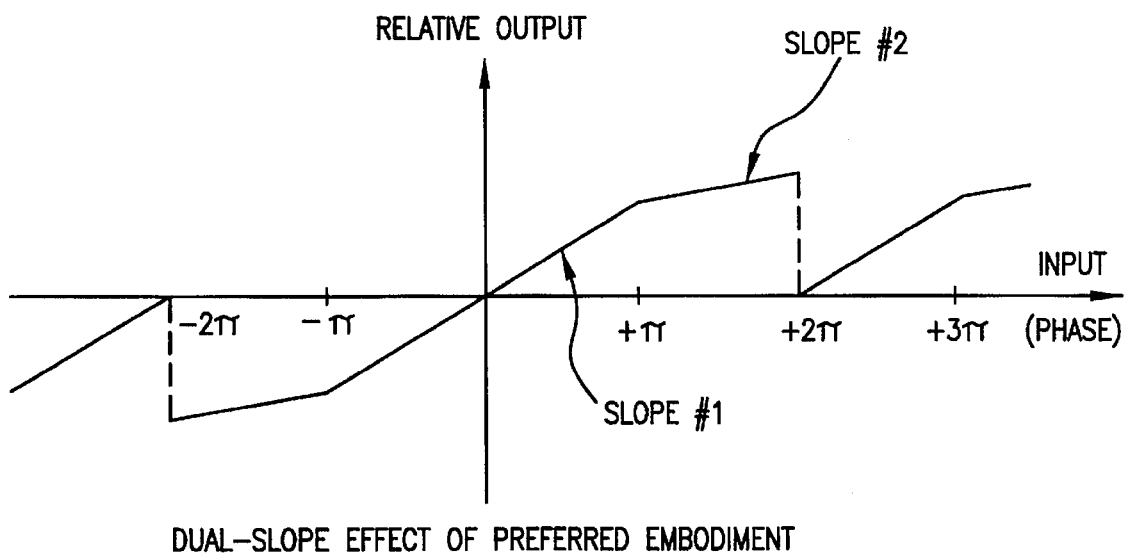
FIG. 17 shows the response of the circuitry of FIG. 16.

FIG. 16 is the two-detector arrangement as used in Detector circuitry block 104 (FIG. 4) and is similar to the arrangement of FIG. 13 but with additional AND gates 316 and 318. Thus the output at OR gates 302 and 304 is the same as with the arrangement of FIG. 13 as illustrated in FIG. 14, and the output of AND gates 316 and 318 indicates the overlap of the outputs of the two detectors which is zero for phase differences less or equal to $\pi$ and is 100% for a phase difference of $2\pi$. The AND gate outputs are fed to a different gain control circuit in VCXO 106 than the outputs of the OR gates so the net effect is the two-slope output as shown in FIG. 17. The advantages of a two-slope control of VCXO include having a control loop with different behavior in lock versus out of lock, and independent control of corner frequency versus buffer depth without resorting to a different type of phase detector.

Figure 18:
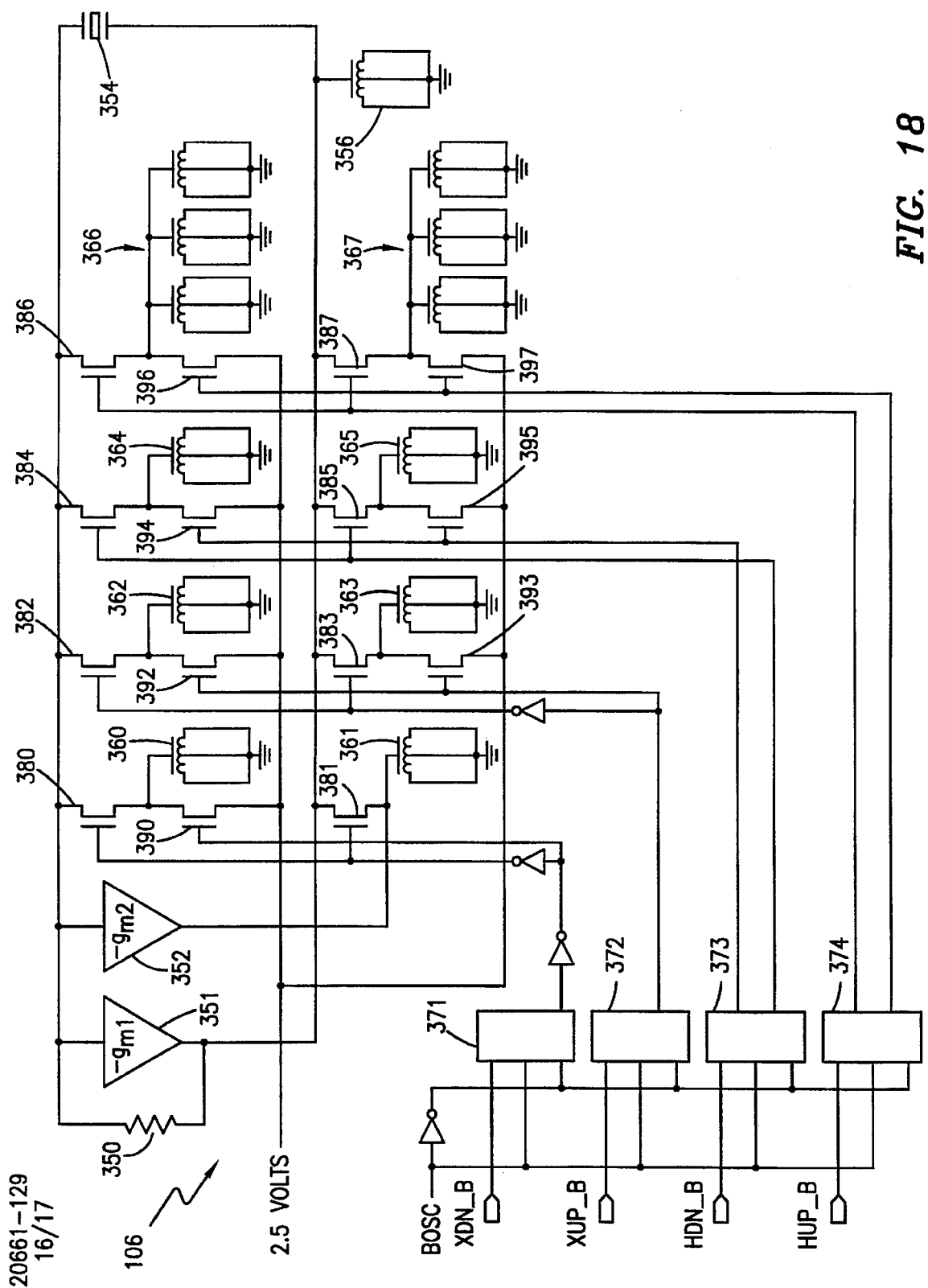
FIG. 18 shows a preferred embodiment voltage controlled crystal oscillator.

FIG. 18 is a schematic diagram of voltage controlled crystal oscillator 106 which includes amplifiers 351 and 352 with negative transconductance $-g_{m1}$ and $-g_{m2}$, respectively, bias resistor 350, 6.176 MHz crystal 354, 3 pF capacitor 356, and loading capacitors 360–367, and operates as an LC feedback oscillator with crystal 354 having a resonance at 6.176 MHz. In order to understand oscillator 106, first consider a simplified oscillator analysis.

Figure 19:
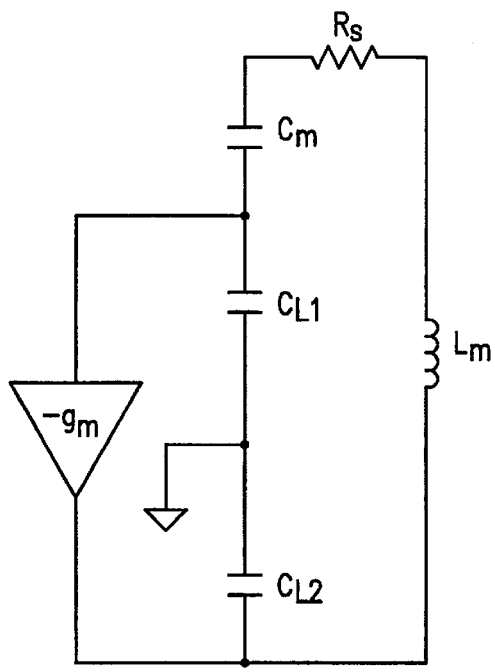
FIG. 19 illustrates a model crystal oscillator.

FIG. 19 shows a simplified model of a crystal oscillator; the crystal mechanical motion impedance is represented electrically by the series inductor $L_m$, capacitor $C_m$, and resistor $R_s$ (which also includes any other series resistance), the crystal electrode capacitance plus loading capacitance is represented by $C_{L1}$ and $C_{L2}$, and the driver has a negative transconductance of $-g_m$. The parallel resonant angular frequency is given approximately by:

$$\omega^2 = 1/L_m C_m [1 - C_m/(C_m + C_{L1} + C_{L2})]$$

$C_m$ is much smaller than $C_{Lj}$ even if no external loading capacitors are involved and only the crystal electrode capacitance is considered. Hence, the resonant frequency remains close to $\omega^2 = 1/L_m C_m$ for all values of the loading capacitance, but varying the loading capacitance does provide a shift in the oscillation frequency. And oscillations will arise and be sustained if sufficient gain is provided: $g_m$ must be at least as large as $R_s \omega^2 C_{L1} C_{L2}$. Thus with larger load capacitance (as when the oscillation frequency is to be decreased) a greater gain is required to sustain oscillation.

The Capacitors 360 and 361 are about 55 pF, capacitors 362 and 363 are about 17 pF, capacitors 364 and 365 about 6.5 pF, and capacitors 366 and 367 are selectable from 2 to 9 pF by options in the metal interconnection layer during fabrication of attentuator 100 as an integrated circuit. For examplary purposes, presume that the crystal electrode capacitance is roughly 4 pF and the crystal mechanical motion equivalent capacitance $C_m$ is roughly 15 fF; thus $L_m$ is about 50 mH for a 6 MHz oscillation. Also, presume $R_s$ is roughly 100 $\Omega$, 20 $\Omega$ from the mechanical motion equivalent resistance of the crystal and 80 $\Omega$ from other series resistances. Then the minimal gain needed with 20 pF for each loading capacitor is about 60 umhos.

Flip-flops 371–374 are clocked at the undivided oscillator frequency XCLK and have data inputs XDN_B, XUP_B, HDN_B, and HUP_B, respectively. For example, if the divided jittered clock WQX5 and the divided crystal clock RQX5 are in phase, then the inputs XDN_B, XUP_B, HDN_B, and HUP_B are all constant highs, so the Q output of each of flip-flops 371–374 is also a constant high. Thus FETs 390, 382, 383, 394, 395, 386, and 387 are turned on and FETs 380, 381, 392, 393, 384, 385, 396, and 397 are turned off. This connects capacitors 362, 363, 366, and 367 to the crystal and provides 20 pF (assuming 366 and 367 are each 3 pF) loading from each node of crystal 354 to ground. Also, capacitors 360, 364, and 365 are connected to a 2.5 volt (½ Vdd) bias line and capacitor 361 connected to the output of driver 352 also holds it about 2.5 volts; this keeps the capacitors half charged so the oscillations start at the proper frequency when they are connected to the crystal.

Now consider the case of the divided jittered clock WQX5 leading the divided crystal clock RQX5 by a phase less than $\pi$, then the signals at phase detector 198 and 200 output nodes U1 and U2 (see FIG. 4) are each a series of positive pulses with a phase difference of $\pi$ and no overlap. XUP_B is an inversion of the sum of the U1 and U2 signals and HUP_B is a constant high. Also, the outputs at nodes D1 and D2 are both low, so XDN_B and HDN_B are also constant highs. Thus the Q outputs of flip-flops 371, 373, and 374 are constant highs, whereas the Q output of flip-flop 372 is essentially the inversion of the series of pulses with duty cycle twice the phase difference of WQX5 and RQX5. Note that flip-flops 371–374 are clocked at XCLK (6.176 MHz) but that phase detectors 198 and 200 have a cycle time corresponding to RQX5 (48.25 KHz; i.e., 1.544 MHz divided by 32), so the quantization error due to clocking flip-flops 371–374 is negligible. Recall that XCLK is divided by 4.0 in block 108 to produce RRCLK at 1.544 MHz.

The varying output of flip-flop 372 implies that capacitors 362 and 363 are alternately connected to and disconnected from crystal 354, so the loading capacitance from each node of crystal 354 switches from 20 pF to 3 pF and back at 48.25 KHz. Thus the $C_m/(C_m+C_{L1}+C_{L2})$ factor switches from roughly ⅟1600 to ⅟500 and back, and the oscillation frequency does not vary much but it does increase, and this reduces the phase difference of RQX5 with WQX5 because RQX5 catches up during the higher frequency oscillations.

Similarly, if the phase difference between WQX5 and RQX5 were greater than $\pi$, then XUP_B would be a constant low and further HUP_B would be alternating between high and low. In this case the loading capacitance on each node of crystal 354 would be switching between 3 pF and 0 pF, and the $C_m/(C_m+C_{L1}+C_{L2})$ factor switches from ⅟500 to ⅟300 and back, so the oscillation frequency would be jumping to even higher levels and RQX5 catches up faster.

Conversely, if the phase difference between WQX5 and RQX5 were small but negative (that is, RQX5 were leading), then XDN_B would be the one alternating from high to low and back, and this would mean that the loading capacitance on each node of crystal 354 is switching from 20 pF to 75 pF and back. This increase in capacitive loading decreases the resonance frequency, and the jumnping to a lower frequency decreases the magnitude of the negative phase difference. Lastly, if the phase difference were greater than π and negative, then HDN_B is the variable signal and the loading capacitance switches between 75 pF and 81.5 pF and further decreases the resonance frequency.

Oscillator 106 has the feature of two gain devices, 351 and 352, with transconductances $-g_{m1}$ and $-g_{m2}$, respectively, where $g_{m1}$ is large enough to sustain oscillations with the loading capacitors 356 and 362–367 (all capacitors except the 55 pF capacitors 360–361) connected to the crystal, and $g_{m2}$ adds enough gain to sustain oscillations with capacitors 360–361 also connected. Thus if minimal $g_{m1}$ and $g_{m2}$ were used, then $g_{m2}$ should be roughly $2g_{m1}$ because the total load capacitance without the two 55 pF capacitors is about 64 pF (presuming 3 pF each for capacitors 366–367), and the two 55 pF capacitors add another 110 pF. This use of two drivers 351 and 352 permits lower power operation and less power dissipated in the crystal which implies less crystal aging, less generation of harmonics, and a smaller chance of oscillation in spurious modes. Indeed, if a single driver were used, then its $g_m$ would need to be at least $3g_{m1}$. Note that the drivers 351 and 352 may be realized simply as common source n-channel FETs with the transconductances set by the gate width to length ratios. Alternative drivers include differential amplifiers and CMOS inverters with controlled bias currents and ac grounded p-channel sources.

An alternative embodiment detector arrangement would be to have more than two detectors (such as delay the clocks by about one-half cycle and feed this to two more detectors and OR all four outputs) and so further increase the gain for phase differences small relative to a cycle. Indeed, with K detectors feed delayed clocks throughout a cycle, the detector arrangement would have a gain of K for phase differences less than 1/K cycle. With more more detectors a multislope control of the VCXO is possible, and a greater number of loading capacitors could be used. And each loading capacitor could have its own driver, or the drivers could be associated with different size groupings of the capacitors.

Modifications and Variations

The preferred embodiments may be modified while retaining one or more of the features of two or more phase/frequency detectors, partial reset of detectors in response to potential FIFO overflow/underflow, dual or multi slope detector gain, two or more crystal oscillator drivers, . . . For example, the preferred embodiments could have a mode of operation in which the jittered clock and data are passed through without change, the FIFO buffer depth could be adjustable to tradeoff delay versus flexibility, built-in test circuits may be incorporated, external reset may be included, the size and number of crystal loading capacitors could be varied or even varactors used for a continuous frequency change, the number of crystal oscillator drivers could be changed, the crystal for the crystal oscillator may be packaged with the circuitry and eliminate the terminals XTAL1 and XTAL2 in FIGS. 3a–b, and the FIFO may read or write some or all bits in parallel.

What is claimed is:

1. A method of detecting the phase difference between a first and a second digital signal, comprising the steps of:
   providing first and second phase detectors having digital outputs;
   inputting first and second digital signals to said first phase detector;
   logically inverting said first and second digital signals;
   inputting said logically inverted first and second signals to said second phase detector; and
   logically combining the digital outputs of said first and second phase detectors to create a plurality of combination of logical outputs of said first and second phase detectors, wherein a first combination output of said plurality of combinations of logical outputs is a logical OR of the outputs of said first and second phase detectors, and wherein a second combination output of said plurality of combinations of logical outputs is a logical AND of the outputs of said first and second phase detectors.

2. A jitter attenuator, comprising:
   a first phase-frequency comparator having at least two inputs, one input connected to a first node and one input connected to a second node and having at least two outputs;
   a second phase-frequency comparator having at least two inputs, one input connected to an output of a first inverter and one input connected to an output of a second inverter, wherein an input of said first inverter is connected to said first node and wherein an input of said second inverter is connected to said second node, said second phase-frequency comparator also having at least two outputs;
   a first logic device having a first input and a second input, said first input being connected to a first output of said first phase-frequency comparator and said second input being connected to a corresponding first output of said second phase-frequency comparator;
   a second logic device having a first input and a second input, said first input being connected to a second output of said first phase-frequency comparator and said second input being connected to a corresponding second output of said second phase-frequency comparator; and
   wherein said inputs of said second phase-frequency comparator are logical opposites of said inputs of said first phase-frequency comparator.

3. A phase detecting system, comprising:
   a first phase-frequency detecting means for detecting phase shifts between the leading edge of a first signal and a second signal;
   a second phase-frequency detecting means for detecting phase shifts between the falling edge of said first signal and said second signal; and
   logic means for producing an output signal, which output signal is formed by digitally combining an output of said first phase-frequency detecting means and an output of said second phase-frequency detecting means, wherein the output signal of said logic means is a logic one for the period between leading edges of corresponding pulses of said first and said second signals and for the period of falling edges of corresponding pulses of said first and said second signals.

4. The phase detecting system of claim 3 wherein the output signal of said logic means is also a logic one for the period of time in which the phase difference between the first signal and the second signal ranges from pi to 2 pi radians.

5. The phase detecting system of claim 4 wherein said output signal has continuous and linear gain for a phase difference between said first signal and said second signal ranging from (−) pi radians to (+) pi radians.

6. The phase detecting system of claim 4 wherein said output signal has at least three stable gain regions, wherein a first stable gain region exists for a phase difference ranging from (−) 2 pi radians to (−) pi radians, a second stable gain region exists from (−) pi radians to (+) pi radians, and third stable gain region from (+) pi radians to (+) 2 pi radians.

7. The phase detecting system of claim 6 wherein said output signal has a flat gain for said first and said third stable gain regions.

* * * * *